US007220653B2

(12) United States Patent
Lee et al.

(10) Patent No.: US 7,220,653 B2
(45) Date of Patent: May 22, 2007

(54) PLASMA DISPLAY PANEL AND MANUFACTURING METHOD THEREOF

(75) Inventors: Jong-Sang Lee, Suwon-si (KR); Byung-Kwan Song, Suwon-si (KR); Jin-Beyung Lee, Suwon-si (KR); Cheol-Hee Moon, Suwon-si (KR); Chang-Seok Rho, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/998,148

(22) Filed: Nov. 29, 2004

(65) Prior Publication Data

US 2005/0148151 A1 Jul. 7, 2005

(30) Foreign Application Priority Data

Nov. 29, 2003 (KR) ..................... 10-2003-0086137

(51) Int. Cl.
*H01L 21/76* (2006.01)

(52) U.S. Cl. .................. 438/401; 438/29; 257/E21.507

(58) Field of Classification Search ................ 438/782, 438/401, 29, 67, 975, 778; 257/89, E21.505, 257/E21.704; 313/582, 586

See application file for complete search history.

(56) References Cited

U.S. PATENT DOCUMENTS 5,541,618 A 7/1996 Shinoda ....................... 345/60
5,661,500 A 8/1997 Shinoda et al. ............... 345/60
5,663,741 A 9/1997 Kanazawa ................... 345/67
5,674,553 A 10/1997 Shinoda et al. ............... 427/68
5,724,054 A 3/1998 Shinoda ........................ 345/60
5,786,794 A 7/1998 Kishi et al. .................... 345/60
5,876,884 A * 3/1999 Maeda et al. ................. 430/22
5,952,782 A 9/1999 Nanto ........................ 313/584

(Continued)

FOREIGN PATENT DOCUMENTS

JP 02-148645 6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Caridad Everhart
(74) *Attorney, Agent, or Firm*—Robert E. Bushell, Esq.

(57) ABSTRACT

A manufacturing method of a plasma display panel and the plasma display panel made using the manufacturing method include the align marks being maintained in a discernible state. The method for manufacturing a plasma display panel includes forming electrodes on a substrate along one direction, and forming align marks on edges of the substrate, depositing a dielectric paste on the substrate covering the align marks, drying the dielectric paste, and baking the dielectric paste to thereby form a dielectric layer. The align marks are left fully remaining such that they are easily discernible, thereby making sealing and other processes easy.

24 Claims, 4 Drawing Sheets

U.S. PATENT DOCUMENTS

| | | | | |
|---|---|---|---|---|
| 6,232,717 | B1 * | 5/2001 | Oida et al. | 313/586 |
| RE37,444 | E | 11/2001 | Kanazawa | 345/66 |
| 6,433,489 | B1 | 8/2002 | Tanaka et al. | 315/169.4 |
| 6,501,526 | B1 * | 12/2002 | Oh | 349/155 |
| 6,630,916 | B1 | 10/2003 | Shinoda | 345/60 |
| 6,707,436 | B2 | 3/2004 | Setoguchi et al. | 345/60 |
| 2004/0070342 | A1 * | 4/2004 | Watanabe et al. | 313/586 |
| 2004/0072495 | A1 * | 4/2004 | Yonehara et al. | 445/59 |
| 2005/0098254 | A1 * | 5/2005 | Yamamoto et al. | 156/64 |

FOREIGN PATENT DOCUMENTS

| | | | |
|---|---|---|---|
| JP | 08062597 | A * | 3/1996 |
| JP | 2845183 | | 10/1998 |
| JP | 2917279 | | 4/1999 |
| JP | 2000-100327 | | 4/2000 |
| JP | 2001-043804 | | 2/2001 |
| JP | 2001-325888 | | 11/2001 |
| KR | 10-2001-0043102 | | 5/2001 |

* cited by examiner

PLASMA DISPLAY PANEL AND MANUFACTURING METHOD THEREOF

CLAIM OF PRIORITY

This application makes reference to, incorporates the same herein, and claims all benefits accruing under 35 U.S.C. §119 from an application for PLASMA DISPLAY PANEL AND MANUFACTURING METHOD THEREOF earlier filed in the Korean Intellectual Property Office on 29 Nov. 2003 and there duly assigned Serial No. 2003-86137.

BACKGROUND OF THE INVENTION

1. Field of the Invention

The present invention relates to a plasma display panel (PDP) and a method for manufacturing the same. More particularly, the present invention relates to a manufacturing method of a PDP in which align marks are maintained in a discernible state, and to a PDP made using the manufacturing method.

2. Description of the Related Art

A PDP is a display device that realizes the display of images through excitation of phosphors by plasma discharge. That is, predetermined voltages are applied between two electrodes mounted in a discharge region of the PDP to thereby effect plasma discharge therebetween. Ultraviolet rays generated during plasma discharge excite phosphor layers that are formed in a predetermined pattern, thereby realizing the display of images. The different types of PDPs include the AC-PDP, DC-PDP, and hybrid PDP.

A conventional PDP includes a lower substrate and an upper substrate provided opposing one another with a predetermined gap (i.e., discharge gap) therebetween. A plurality of address electrodes are formed on a surface of the lower substrate opposing the upper substrate. The address electrodes are formed in a stripe pattern substantially along the Y direction. A dielectric layer is formed on the lower substrate covering the address electrodes, and a plurality of barrier ribs are formed on the dielectric layer. The barrier ribs define discharge cells, maintain the discharge gap, and prevent crosstalk between the discharge cells. A phosphor layer is formed between each adjacent pair of the barrier ribs covering the dielectric layer therebetween and side walls of the barrier ribs.

Formed on a surface of the upper substrate opposing the lower substrate are a plurality of display electrodes. The display electrodes are formed substantially along the X direction, that is, substantially along a direction perpendicular to the address electrodes. A dielectric layer and an MgO protection layer are formed on the upper substrate covering the display electrodes.

During manufacture of the PDP, align marks are formed and used as reference points in aligning the lower and upper substrates prior to sealing together the same, and in performing an exposure process. An electrode paste is typically used for the formation of the align marks during the formation of bus electrode (i.e., the display electrodes) in the case of the upper substrate, while an electrode paste is typically used for the formation of the align marks during the formation of the address electrodes in the case of the lower substrate. In recent times, however, a laser has been employed to form the align marks.

It is preferable that none of the elements of the PDP (or portions thereof) are positioned over the align marks in order to ensure full visibility of the align marks. Accordingly, a screen mask must be used during manufacture of the dielectric layers that does not leave the align marks exposed in order to ensure that the dielectric paste is not deposited on the align marks.

However, during drying and baking of the dielectric paste, the align marks, which are exposed during these processes, become oxidized and discolored. This makes the align marks unclear, and therefore causes difficulties in the alignment of the lower and upper substrates.

SUMMARY OF THE INVENTION

In accordance with the present invention, a plasma display panel is provided that includes align marks which are protected from external heat during the formation of a dielectric layer, and, at the same time, are easily discernible during alignment.

It is another object to provide during formation of the dielectric layer on the substrate of the plasma display panel according to the present invention, a new process utilizing a coater or lamination sheet being introduced such that, ultimately, discharge characteristics are improved, and, at the same time, the align marks are prevented from undergoing oxidation and discoloration, thereby making the processes involved in manufacture of the plasma display panel easier.

It is yet another object to provide the dielectric paste being deposited on the substrate covering the align marks, accommodating the oxidation and discoloration of the align marks being prevented during drying and baking of the dielectric layer, thereby preventing a situation where the align marks are difficult to discern and accordingly, sealing of the front substrate and the rear substrate is made easy.

It is still another object by forming a transparent dielectric layer on the front substrate of the plasma display panel, the align marks are easily visible through the dielectric layer.

It is another object to provide the dielectric layer formed using a coater or lamination sheet accommodating the dielectric layer being realized as a single layer to make the align marks even more discernible.

A method for manufacturing a plasma display panel includes forming electrodes on a substrate along one direction, and forming align marks on edges of the substrate; depositing a dielectric paste on the substrate covering the align marks; drying the dielectric paste; and baking the dielectric paste to thereby form a dielectric layer.

In the step of depositing the dielectric paste, a coater is used to deposit the dielectric paste.

In the step of depositing the dielectric paste, the dielectric paste is deposited in the form of a lamination sheet.

In the step of forming electrodes, the electrodes are display electrodes.

In the step of forming the dielectric layer, the dielectric layer is formed as a single layer, and is realized by a transparent dielectric material.

The plasma display panel includes a front substrate and a rear substrate mounted opposing one another; align marks formed in proximity to edges in a region where the front substrate and the rear substrate oppose one another and overlap; and an align mark protection layer formed on the front substrate covering the align marks.

The plasma display panel further includes electrodes formed adjacent to the front substrate, and a dielectric layer formed on the front substrate covering the electrodes. The align mark protection layer is formed of the same material as the dielectric layer.

The align mark protection layer is formed integrally with the dielectric layer, and is realized by a transparent dielectric layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 4:
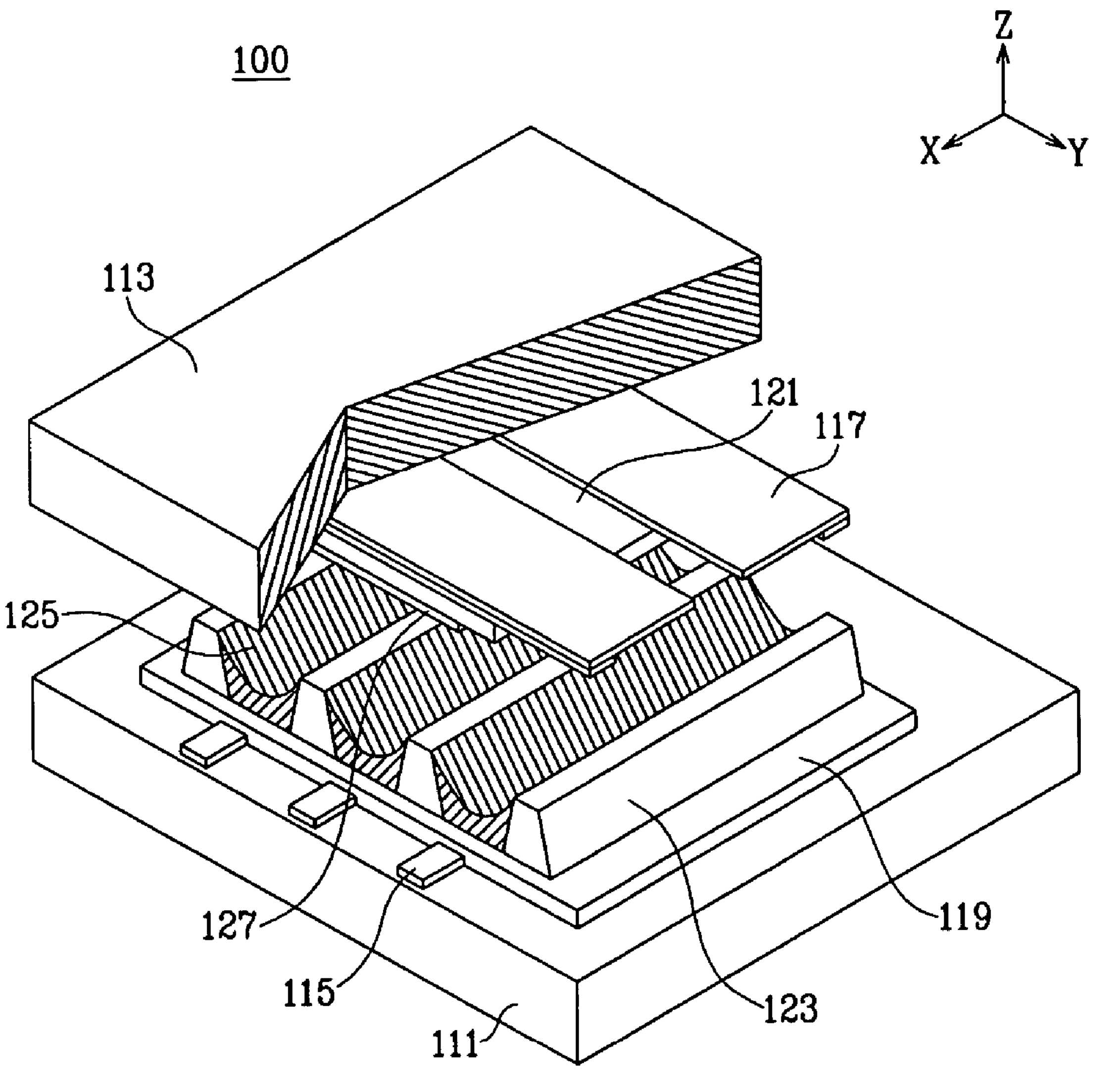
FIG. 4 is a partial exploded perspective view of a conventional plasma display panel.

Turning now to the drawings, FIG. 4 shows a partial exploded perspective view of a conventional PDP 100. The conventional PDP 100 includes a lower substrate 111 and an upper substrate 113 provided opposing one another with a predetermined gap (i.e., discharge gap) therebetween. A plurality of address electrodes 115 are formed on a surface of the lower substrate 111 opposing the upper substrate 113. The address electrodes 115 are formed in a stripe pattern substantially along the Y direction as shown in FIG. 4. A dielectric layer 119 is formed on the lower substrate 111 covering the address electrodes 115, and a plurality of barrier ribs 123 are formed on the dielectric layer 119. The barrier ribs 123 define discharge cells, maintain the discharge gap, and prevent crosstalk between the discharge cells. A phosphor layer 125 is formed between each adjacent pair of the barrier ribs 123 covering the dielectric layer 119 therebetween and side walls of the barrier ribs 123.

Formed on a surface of the upper substrate 113 opposing the lower substrate 111 are a plurality of display electrodes 117. The display electrodes 117 are formed substantially along the X direction, that is, substantially along a direction perpendicular to the address electrodes 115. A dielectric layer 121 and an MgO protection layer 127 are formed on the upper substrate 113 covering the display electrodes 117.

During manufacture of the PDP, align marks are formed and used as reference points in aligning the lower and upper substrates 111, 113 prior to sealing together the same, and in performing an exposure process. An electrode paste is typically used for the formation of the align marks during the formation of bus electrode (i.e., the display electrodes 117) in the case of the upper substrate 113, while an electrode paste is typically used for the formation of the align marks during the formation of the address electrodes 115 in the case of the lower substrate 111. In recent times, however, a laser has been employed to form the align marks.

It is preferable that none of the elements of the PDP (or portions thereof) are positioned over the align marks in order to ensure full visibility of the align marks. Accordingly, a screen mask must be used during manufacture of the dielectric layers 119, 121 that does not leave the align marks exposed in order to ensure that the dielectric paste is not deposited on the align marks.

However, during drying and baking of the dielectric paste, the align marks, which are exposed during these processes, become oxidized and discolored. This makes the align marks unclear, and therefore causes difficulties in the alignment of the lower and upper substrates 111, 113.

Exemplary embodiments of the present invention will now be described in detail with reference to the drawings.

Figure 1:
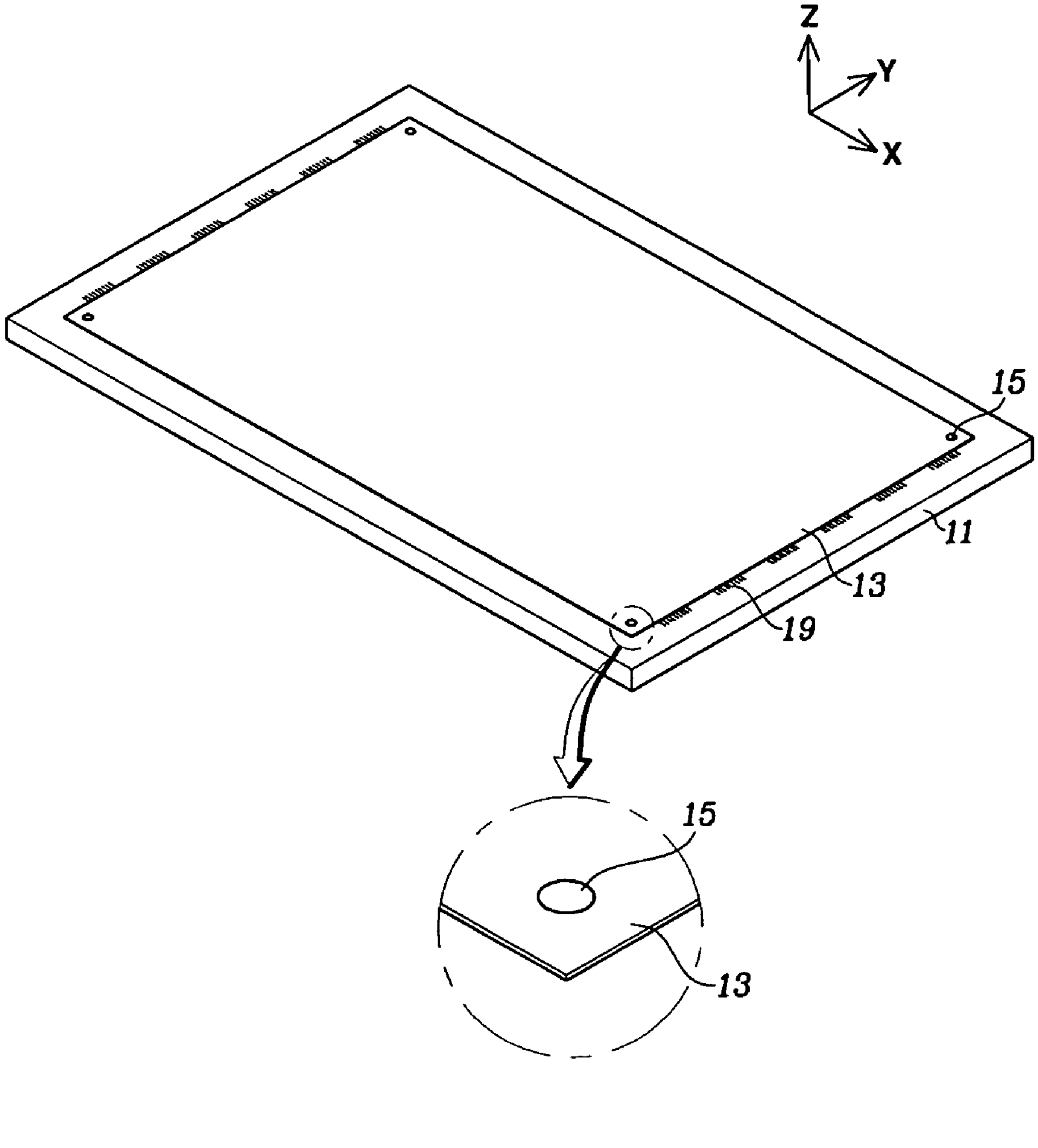
FIG. 1 is a perspective view of a front substrate on which there is deposited a dielectric layer over align marks according to an exemplary embodiment of the present invention.

FIG. 1 is a perspective view of a front substrate on which there is deposited a dielectric layer over align marks according to an exemplary embodiment of the present invention.

With reference to FIG. 1, in a plasma display panel according to an exemplary embodiment of the present invention, a plurality of display electrodes 19 are formed along one direction (direction X in the drawing) on a front substrate 11, and a dielectric layer 13 is formed on the display electrodes 19. In a subsequent process, an MgO layer (not shown) is formed on the dielectric layer 13 to protect the dielectric layer 13, and, at the same time, increase a secondary electron emission coefficient.

Although not shown, a rear substrate of the plasma display panel is mounted opposing the front substrate 11. A plurality of address electrodes (not shown) are formed on a surface of the rear substrate opposing the front substrate 11 along a direction substantially perpendicular to the direction along which the display electrodes 19 are extended (i.e., substantially along the Y direction in the drawing of FIG. 1).

A pixel is formed at each area where the address electrodes intersect the display electrodes 19, and the combination of all the formed electrodes forms a display region. That is, the display region is realized by the intersection of the address electrodes and the display electrodes 19 in the area where the front substrate 11 and the rear substrate overlap, and is an area where display discharge takes place by the application of drive voltages to these electrodes.

Although not shown, a plurality of barrier ribs are formed in the display region. The barrier ribs define each of the pixels into individual discharge cells, and support the front substrate 11 and the rear substrate. Phosphors that generate visible light are deposited in the discharge cells.

With reference to FIG. 1, an exterior area outside the display region that is not covered by the dielectric layer 13 may be designated as a non-display region where discharge does not occur. Terminal regions of each of the electrodes are formed in the non-display region and connected to a drive circuit (not shown) through an electrical connecting means such as an FPC (flexible printed circuit). As shown in FIG. 1, the dielectric layer 13 is deposited so that it does not cover the terminal regions of the display electrodes in order to allow for connection with an FPC (not shown). The dielectric layer 13 is, however, formed covering align marks 15. The align marks 15 are placed to facilitate precise alignment between each structural element during manufacture of the panel. Using the align marks 15 as a reference, electrode arrangement may be adjusted or the interconnection between the front substrate and the rear substrate maybe made more precise. The align marks 15 are formed in peripheral areas in the region where the front substrate 11 and the rear substrate overlap and oppose one another.

In the plasma display panel according to the exemplary embodiment of the present invention, the application of a drive signal is received from the display electrodes to thereby effect address discharge between the address electrodes and form a wall charge on the dielectric layer. A sustain discharge is affected between a pair of display electrodes selected by the address discharge by an alternating signal supplied alternatingly to the display electrodes. Accordingly, a discharge gas filled in a discharge space formed by the discharge cells is excited, and generates ultraviolet rays. Visible light is generated through the excitation of the phosphors by the ultraviolet rays to thereby realize the formation of images.

In the preferred embodiment of the present invention, the align marks 15 are formed along edges of the front substrate of the plasma display panel during the formation of the display electrodes 19. The align marks 15 are shown in FIG. 1 as being formed in four corners of the front substrate of the plasma display panel. However, this is merely one example of how the align marks 15 may be formed and the present invention is not limited in this respect. The align marks 15 may also be formed along the edges of the front substrate of the plasma display panel.

In the preferred embodiment of the present invention, the align marks 15 are easily discernible even though they are formed under the dielectric layer 13 as shown by the enlarged circle in FIG. 1. Further, with this formation of the dielectric layer 13 over the align marks 15, the problems of oxidation and discoloration of the align marks 15 occurring as a result of the heat used to dry and sinter the dielectric layer 13 are solved. That is, the dielectric layer 13 covering the align marks 15 acts as an align mark protection layer. Accordingly, in the exemplary embodiment, the align mark protection layer is formed integrally with and of the same material as the dielectric layer 13, and may be formed using a transparent dielectric material.

In the plasma display panel according to the exemplary embodiment of the present invention described above, the dielectric layer is formed using the method described in the following and in such a manner that the align marks are not damaged and are easily discernible.

First, electrodes are formed along one direction of a substrate, and align marks are formed along edges of the substrate. In FIG. 1, although the display electrodes formed on the front substrate of the plasma display panel are shown, this is merely an example of the present invention and the present invention is not limited in this respect. Accordingly, in the case where the degree of transparency of the dielectric layer formed on a rear substrate of the plasma display panel is high, the align marks may be formed at the same time the address electrodes are formed, that is, during manufacture of the rear substrate of the plasma display panel.

After formation of the electrodes, a dielectric paste is deposited on the substrate covering the align marks. One or a mixture of $PbO$, $B_2O_3$, $SiO_2$, $Al_2O_3$, $BaO$, and $ZnO$, which result in a transparent dielectric material, may be used for the dielectric paste. By using a transparent dielectric material, the align marks are easily discernible therethrough even when covered by the dielectric layer. Following deposition of the dielectric paste on the substrate, the substrate is placed in a drying furnace and the dielectric paste is dried. After the dielectric paste is dried, the substrate is placed in a baking furnace, and baking is performed at a temperature between 350° C. and 580° C. (Celsius) to thereby form the dielectric layer.

By forming the dielectric layer 13 over the align marks 15 using this method, the possibility of the align marks 15 becoming oxidized or discolored during baking of the dielectric paste is significantly reduced, thereby making sealing of the front substrate and the rear substrate of the plasma display panel easy. If, rather than using the conventional screen printing method, a method utilizing a coater or lamination sheet is applied to form the dielectric layer 13, the align marks 15 become even more visible.

Dielectric layer formation methods according to first and second exemplary embodiments of the present invention will be described below with reference to FIGS. 2 and 3.

Figure 2:
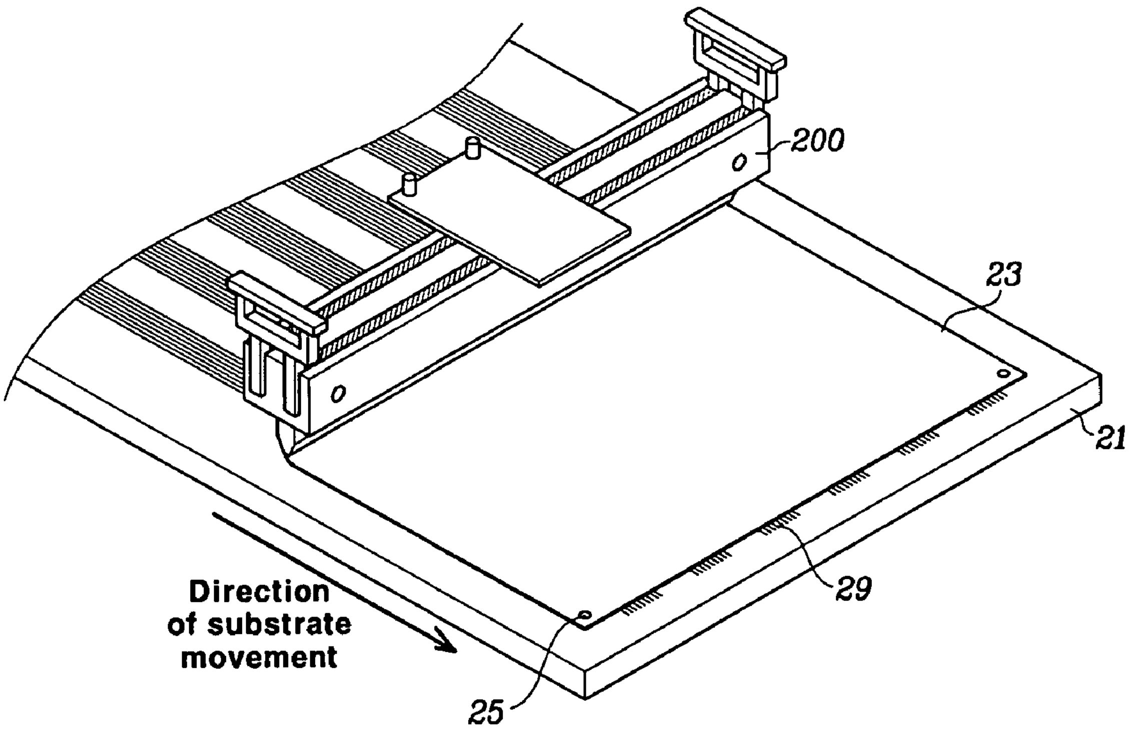
FIG. 2 is a schematic view illustrating a method for manufacturing a plasma display panel according to a first exemplary embodiment of the present invention.

FIG. 2 illustrates a process for forming a dielectric paste 23 on a substrate 21 using a coater 200 according to the first exemplary embodiment of the present invention. The dielectric paste 23 is deposited to form a dielectric layer in such a manner that the dielectric paste 23 does not cover terminal regions of electrodes 29, but does cover align marks 25. In the first exemplary embodiment of the present invention, the substrate 21 is moved in one direction and the coater 200 is moved in the opposite direction during deposition of the dielectric paste 23 to thereby achieve better manufacturing efficiency.

Figure 3:
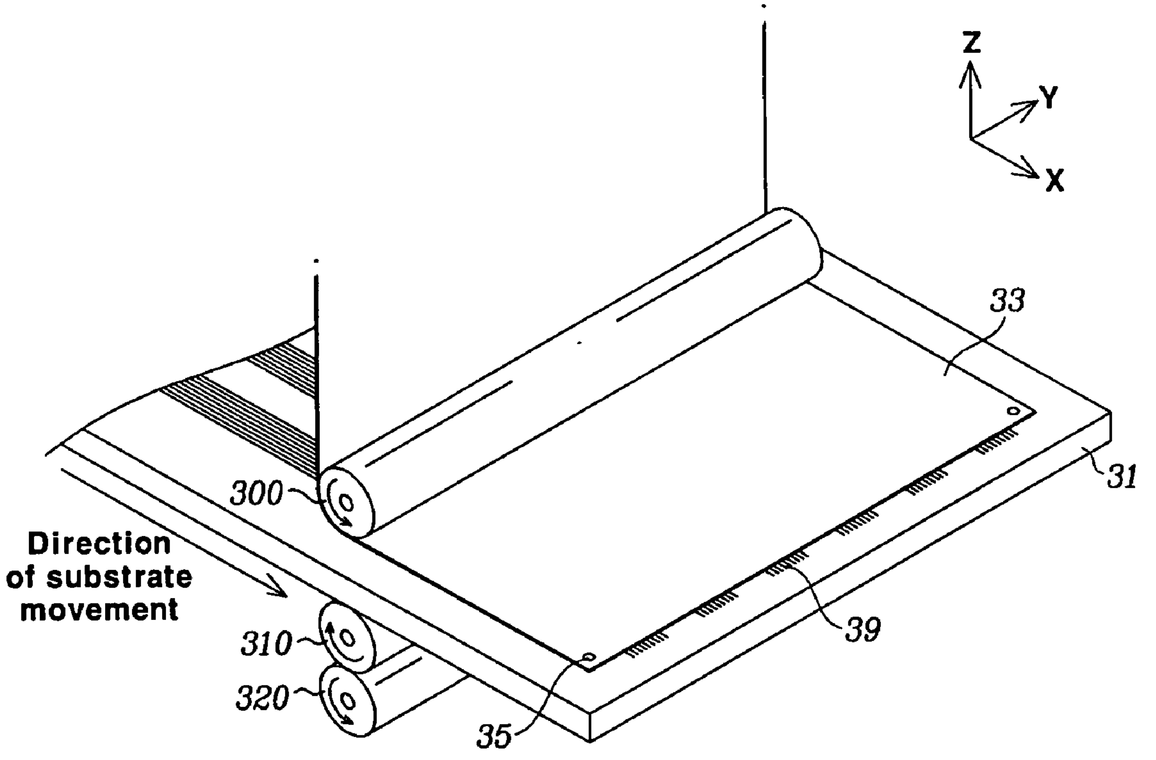
FIG. 3 is a schematic view illustrating a method for manufacturing a plasma display panel according to a second exemplary embodiment of the present invention.

FIG. 3 illustrates a process for forming a dielectric layer on a substrate 31 using a lamination sheet on which there is printed a dielectric paste. Terminal regions of electrodes 39 are not covered by a dielectric paste 33 formed as a lamination sheet, but align marks 35 are covered. In this embodiment, drive rollers 300, 310, 320 are simultaneously operated in directions indicated by the arrows in FIG. 3 to thereby apply the lamination sheet on the substrate 31 while the substrate 31 is being moved.

An advantage of the first and second exemplary embodiments of the present invention described above is that the dielectric layer may be formed as a single layer. That is, in the case of using the coater in the first exemplary embodiment of the present invention, since a thickness of the deposited dielectric paste is adjusted so that a thickness of the dielectric layer resulting from this process may be controlled, the dielectric layer may be formed in a single step without requiring additional dielectric paste deposition, drying, and baking. Accordingly, by forming the dielectric layer on the align marks as a single layer, the transmissivity of light is increased, thereby making the align marks more discernible through the dielectric layer. Ultimately, alignment of the front substrate and the rear substrate may be better performed during sealing of the same.

In the case of using the lamination sheet of the second exemplary embodiment, a thickness of the lamination sheet on which the dielectric paste is deposited is adjusted so that a thickness of the dielectric layer resulting from this process maybe controlled. As a result, the dielectric layer may be formed in a single step without requiring additional dielectric paste deposition, drying, and baking such that the same advantages obtained in the first exemplary embodiment are obtained in the second exemplary embodiment.

As described above, during formation of the dielectric layer on the substrate of the plasma display panel according to the present invention, a new process utilizing a coater or lamination sheet is introduced such that, ultimately, discharge characteristics are improved, and, at the same time, the align marks are prevented from undergoing oxidation and discoloration, thereby making the processes involved in manufacture of the plasma display panel easier.

According to the present invention as described above, since the dielectric paste is deposited on the substrate covering the align marks, oxidation and discoloration of the align marks are prevented during drying and baking of the dielectric layer, thereby preventing a situation where the align marks are difficult to discern. Accordingly, sealing of the front substrate and the rear substrate is made easy.

Further, by forming a transparent dielectric layer on the front substrate of the plasma display panel, the align marks are easily visible through the dielectric layer.

In addition, since the dielectric layer is formed using a coater or lamination sheet, the dielectric layer may be realized as a single layer to make the align marks even more discernible.

Although embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for manufacturing a plasma display panel, comprising:

forming electrodes on a substrate along one direction, and forming align marks on edges of said substrate;

depositing a dielectric paste on said substrate covering said align marks;

drying said dielectric paste; and baking said dielectric paste to thereby form a dielectric layer, discernability of align marks being dependent upon the transmissivity of light of said dielectric paste covering said align marks.

2. The method of claim 1, wherein in the step of depositing said dielectric paste, a coater is used to deposit the dielectric paste.

3. The method of claim 1, wherein in the step of depositing the dielectric paste, said dielectric paste is deposited in the form of a lamination sheet.

4. The method of claim 1, wherein in the step of forming electrodes, said electrodes are display electrodes.

5. The method of claim 1, wherein in the step of forming said dielectric layer, said dielectric layer is a formed as a single layer.

6. The method of claim 1, wherein said dielectric layer is realized by a transparent dielectric material.

7. The method of claim 1, with said dielectric paste being formed directly on said substrate directly covering entirely all of said align marks and accommodating an identification of said align marks to align said substrate with an opposing substrate prior to sealing the two opposing substrates.

8. A plasma display panel, comprising:

a front substrate and a rear substrate mounted opposing one another;

align marks formed in proximity to edges in a region where said front substrate and said rear substrate oppose one another and overlap; and an align mark protection layer formed on said front substrate covering said align marks, align marks being more discernable when a transmissivity of light of said align mark protection layer is increased.

9. The plasma display panel of claim 8, wherein said align mark protection layer is realized by a transparent dielectric layer.

10. The plasma display panel of claim 8, further comprising electrodes formed adjacent to said front substrate, and a dielectric layer formed on said front substrate covering the electrodes, wherein said align mark protection layer is formed of the same material as said dielectric layer.

11. The plasma display panel of claim 10, wherein said align mark protection layer is formed integrally with said dielectric layer.

12. A method of a plasma display panel, comprising:

mounting a front and rear substrate opposing one another;

forming a plurality of electrodes on said front substrate;

forming align marks on said front substrate accommodating aligning said rear and front substrates prior to sealing; and forming a dielectric layer on said front substrate of said plasma display panel and said dielectric layer covering directly said align marks, identification of said align marks being dependent only upon the material forming said dielectric layer.

13. The method of claim 12, the identification of said align marks being according to a degree of transparency of said dielectric layer formed on said rear substrate of said plasma display panel covering said align marks.

14. The method of claim 12, wherein said dielectric material being a transparent dielectric material.

15. The method of claim 12, wherein the step of forming align marks is along edges of said front substrate.

16. The method of claim 12, with said step of forming align mark protection layer including forming said align marks integrally with said dielectric layer.

17. The method of claim 12, wherein said align marks being of the same material as said dielectric layer.

18. The method of claim 12, after formation of said electrodes being display electrodes, said dielectric paste being deposited on the substrate covering said align marks, and said dielectric layer covering the alien marks and not terminal regions of said electrodes.

19. The method of claim 12 with said step of forming said dielectric layer comprising of depositing a dielectric paste, on said front substrate covering the align marks, consisting of a transparent material of one or a mixture PbO, $B_2O_3$, $SiOS_2$, $Al_2O_3$, BaO, and ZnO.

20. The method of claim 12, further comprised of depositing a dielectric paste to form said dielectric layer, to not cover terminal regions of electrodes, but covering said align marks.

21. The method of claim 12, with said dielectric layer being formed as a single layer using a coater in a single step accommodated by a thickness of the deposited dielectric paste used to form said dielectric layer being adjusted to a certain controllable thickness of said dielectric layer.

22. The method of claim 12, with said dielectric layer being formed as a single layer using a lamination sheet in a single step accommodated by a thickness of said lamination sheet on which a dielectric paste used to form said dielectric layer is deposited and adjusted to a certain controllable thickness of said dielectric layer, and said align marks and dielectric layer being formed integrally as a single body of the same material.

23. The method of claim 12, wherein, when a degree of transparency of said dielectric layer formed on said rear substrate of said plasma display panel is higher than a certain degree, said align marks are formed at the same time address electrodes of said plasma display panel are formed.

24. The method of claim 23, wherein the step of forming said dielectric layer is during manufacture of said rear substrate of said plasma display panel. directly on said substrate directly covering entirely all of said align marks and accommodating an identification of said align marks to align said substrate with an opposing substrate prior to sealing the two opposing substrates.

* * * * *